(12) United States Patent
Liu et al.

(10) Patent No.: US 10,447,226 B2
(45) Date of Patent: Oct. 15, 2019

(54) THREE DIMENSIONAL INDUCTOR-CAPACITOR APPARATUS AND METHOD OF FABRICATING

(71) Applicant: QUALCOMM Incorporated, San Diego, CA (US)

(72) Inventors: Yu-Chun Liu, Altamonte Springs, FL (US); Arjun Ravindran, Orlando, FL (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/851,312

(22) Filed: Dec. 21, 2017

(65) Prior Publication Data

US 2019/0200454 A1   Jun. 27, 2019

(51) Int. Cl.

| | | |
|---|---|---|
| *H03H 7/01* | (2006.01) | |
| *H01F 17/00* | (2006.01) | |
| *H05K 1/02* | (2006.01) | |
| *H01L 21/768* | (2006.01) | |
| *H01L 23/522* | (2006.01) | |
| *H01L 49/02* | (2006.01) | |
| *H05K 1/11* | (2006.01) | |
| *H01F 41/04* | (2006.01) | |

(Continued)

(52) U.S. Cl.
CPC ......... *H03H 7/0115* (2013.01); *H01F 41/041* (2013.01); *H01L 21/76832* (2013.01); *H01L 21/76877* (2013.01); *H01L 23/5227* (2013.01); *H01L 28/10* (2013.01); *H05K 1/0284* (2013.01); *H05K 1/119* (2013.01); *H05K 1/165* (2013.01); *H01F 2017/002* (2013.01); *H01F 2017/0026* (2013.01); *H03H 2001/0085* (2013.01)

(58) Field of Classification Search
CPC ...... H01F 2017/002; H01F 2017/0026; H03H 7/0115; H03H 2001/0085; H05K 1/0284
USPC .................................................. 333/175, 185
See application file for complete search history.

(56) References Cited

U.S. PATENT DOCUMENTS

| | | | |
|---|---|---|---|
| 6,762,654 B1 * | 7/2004 | Tanaka ..................... | H03H 7/32 |
| | | | 333/140 |
| 9,247,647 B1 | 1/2016 | Yoon et al. | |

(Continued)

FOREIGN PATENT DOCUMENTS

| | | |
|---|---|---|
| JP | 2001077538 A | 3/2001 |
| JP | 2017092292 A | 5/2017 |

OTHER PUBLICATIONS

International Search Report and Written Opinion—PCT/US2018/059729—ISA/EPO—dated Feb. 4, 2019.

*Primary Examiner* — Rakesh B Patel

(74) *Attorney, Agent, or Firm* — Qualcomm Incorporated

(57) ABSTRACT

Some aspects pertain to an apparatus that includes a plurality of stacked metal layers configured in a spiral shape. The plurality of stacked metal layers include a first metal layer including a first inductor, a second metal layer including a plurality of first pads and a plurality of second pads, a third metal layer including a plurality of third pads and a plurality of fourth pads, a fourth metal layer including a second inductor, a plurality of first vias configured to couple the first metal layer to the second metal layer, a plurality of second vias configured to couple the second metal layer to the third metal layer, a plurality of third vias configured to couple the third metal layer to the fourth metal layer; and a dielectric layer at least partially surrounding the apparatus.

25 Claims, 15 Drawing Sheets

(51) Int. Cl.
H05K 1/16 (2006.01)
H03H 1/00 (2006.01)

(56) References Cited

U.S. PATENT DOCUMENTS

| | | |
|---|---|---|
| 9,460,996 B1 | 10/2016 | Zang et al. |
| 2007/0035363 A1* | 2/2007 | Kameya .................. H03H 7/30 333/140 |
| 2009/0251348 A1* | 10/2009 | Zhao ....................... H04B 1/28 341/155 |
| 2011/0248811 A1 | 10/2011 | Kireev et al. |
| 2014/0177189 A1 | 6/2014 | Liu et al. |

* cited by examiner

Equivalent circuit

THREE DIMENSIONAL INDUCTOR-CAPACITOR APPARATUS AND METHOD OF FABRICATING

BACKGROUND

Field of the Disclosure

Various features relate to an inductor and capacitor apparatus embedded in a substrate.

Background

Integrated circuits, integrated circuit packages and electronic devices are being continually driven to smaller form factors. There is also a need for inductors and capacitors that satisfy the need for a smaller form factor.

FIG. 1 shows an example of an inductor and a capacitor in a packaged system. Specifically, FIG. 1 illustrates a packaged system 100 that includes a die 102, a plurality of first interconnects 104, a substrate 106, a plurality of second interconnects 108, an inductor 110, a capacitor 112, and a printed circuit board (PCB) 114. The inductor 110 is coupled to the PCB 114. The capacitor 112 is coupled to the PCB 114. The inductor 110 and the capacitor 112 require extra space on the PCB. One drawback of the inductor 110 and the capacitor 112 is that it creates a device or packaged system 100 that has a surface area that is too large. For example, the packaged system 100 may be too large for mobile computing devices or wearable computing devices. Another drawback of the inductor 110 and the capacitor 112 is that it is far away from the die 102. In applications such as radio frequency and voltage regulators, the inductor 110 and the capacitor 112 should be close to the die 102.

In other aspect (not shown), the inductor 110 may be embedded inside of the PCB 114. One drawback of this aspect is the space necessary for routing of the inductor to other devices. In another aspect (not shown), the inductor 110 may be mounted on the backside (i.e., the opposing side) of the PCB 114. The backside of the PCB 114 may have solder balls (not shown) for coupling to other devices. One drawback of this aspect is that it requires depopulation of the solder balls to make space for the inductor 110.

Accordingly, there is need for an improved inductor and capacitor that may be placed very close to a die (e.g., die 102) that allows for a smaller compact substrate (e.g., substrate 200).

SUMMARY

Various features relate to a substrate that include an inductor and capacitor apparatus embedded in a substrate.

A first example provides a plurality of stacked metal layers including a first metal layer including a first inductor, the first inductor configured in a spiral shape, a second metal layer including a plurality of first pads and a plurality of second pads, a third metal layer including a plurality of third pads and a plurality of fourth pads, a fourth metal layer including a second inductor, the second inductor configured in a spiral shape, a plurality of first vias configured to couple the first metal layer to the second metal layer, a plurality of second vias configured to couple the second metal layer to the third metal layer, a plurality of third vias configured to couple the third metal layer to the fourth metal layer; and a dielectric layer at least partially surrounding the apparatus.

A second example provides for a method of fabricating an apparatus comprising forming a plurality of stacked metal layers, including forming a first metal layer including forming a first inductor in a spiral shape, forming a second metal layer including forming a plurality of first pads and a plurality of second pads, forming a third metal layer including forming a plurality of third pads and a plurality of fourth pads, forming a fourth metal layer including forming a second inductor in a spiral shape, forming a plurality of first vias and coupling the first metal layer to the second metal layer, forming a plurality of second vias and coupling the second metal layer to the third metal layer, forming a plurality of third vias and coupling the third metal layer to the fourth metal layer and forming a dielectric layer at least partially surrounding the apparatus.

DRAWINGS

Various features, nature and advantages may become apparent from the detailed description set forth below when taken in conjunction with the drawings in which like reference characters identify correspondingly throughout.

DETAILED DESCRIPTION

Figure 1:
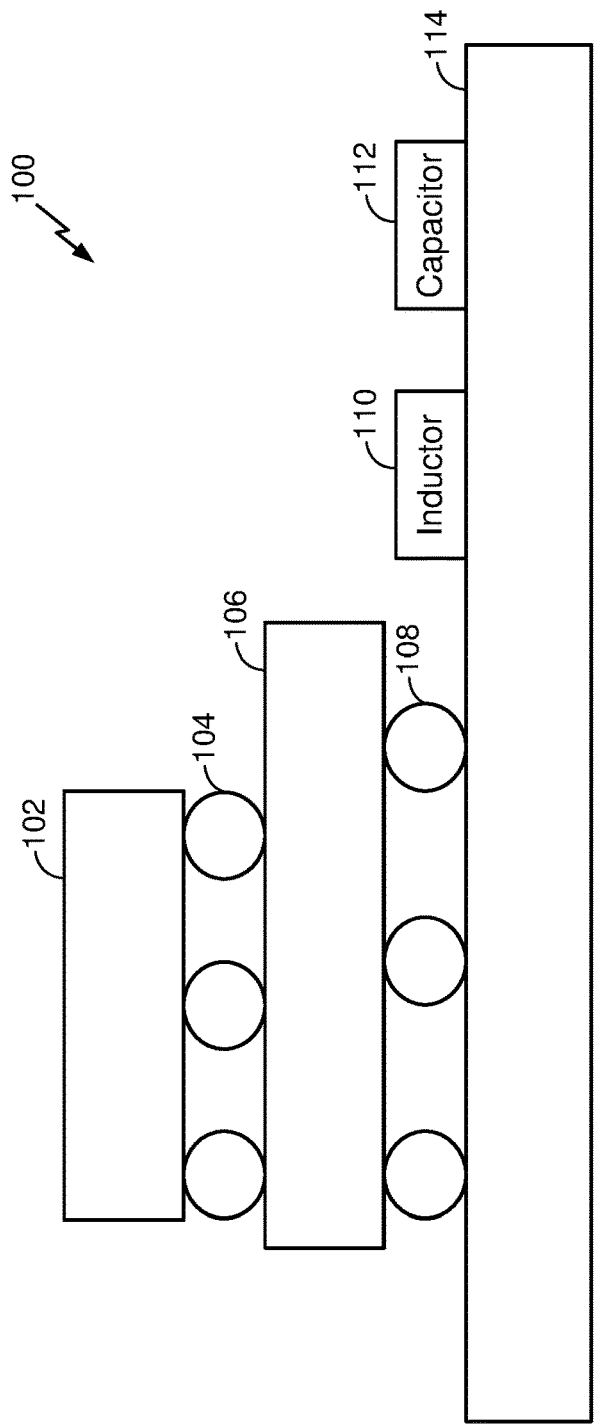
FIG. 1 illustrates a conventional inductor and capacitor in a packaged system.

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to an inductor-capacitor apparatus that includes a plurality of stacked metal layers configured in a spiral shape. The plurality of stacked metal layers include a first metal layer including a first inductor, a second metal layer including a plurality of first pads and a plurality of second pads, a third metal layer including a plurality of third pads and a plurality of fourth pads, a fourth metal layer including a second inductor, a plurality of first vias configured to couple the first metal layer to the second metal layer, a plurality of second vias configured to couple the second metal layer to the third metal layer, a plurality of third vias configured to couple the third metal layer to the fourth metal layer; and a dielectric layer at least partially surrounding the inductor-capacitor apparatus.

The inductor-capacitor apparatus includes a capacitor that may comprise a first, second, and third capacitor, such that the capacitor includes an equivalent capacitance. The capacitor may be formed of any one of the plurality of stacked metal layers, and any other one of the plurality of stacked metal layers, separated only by a dielectric layer. The first capacitor may include includes at least a portion of the first inductor (or first metal layer), and at least a one of the plurality of first pads, separated by the dielectric layer. The second capacitor may include a portion of the second inductor (or fourth metal layer), and at least a one of the plurality of third pads, separated by the dielectric layer. The third capacitor may include a one of the plurality of third pads and a one of a plurality of second vias, and a one of a plurality of fourth pads and a second one of a plurality of second vias, separated by the dielectric layer.

The inductor-capacitor apparatus may be embedded or integrated into a substrate. The inductor-capacitor apparatus results in space-savings in the X, Y plane and results in reduced costs as will be explained. Moreover, the inductor-capacitor may be advantageously used in applications where space savings is important (e.g., mobile devices, wearables etc.), and additionally in applications where a lowered self-resonant-frequency is desired (as compared with an inductor not having an integrated capacitive structure) such as in RF applications. Moreover, the inductor-capacitor apparatus may be used as a bandpass filter or as an RF choke.

Exemplary Inductor-Capacitor Apparatus

FIGS. 2A, 2B, 2C, 2D, 2E, and 2F illustrate the inductor-capacitor 200 in multiple views, on an X, Y, and Z axis. The inductor-capacitor apparatus 200 is three dimensional, in that it has aspects in the X, Y, and Z planes. The inductor-capacitor apparatus 200 is configured in a spiral shape. In one aspect, the inductor-capacitor apparatus 200 may comprise a standalone component configured to be placed with another component that will utilize the inductor-capacitor apparatus 200. In another aspect, the inductor-capacitor apparatus 200 may be embedded in a substrate or integrated into a substrate as will be discussed later in the disclosure with respect to FIGS. 3A and 3B.

Figure 2A:
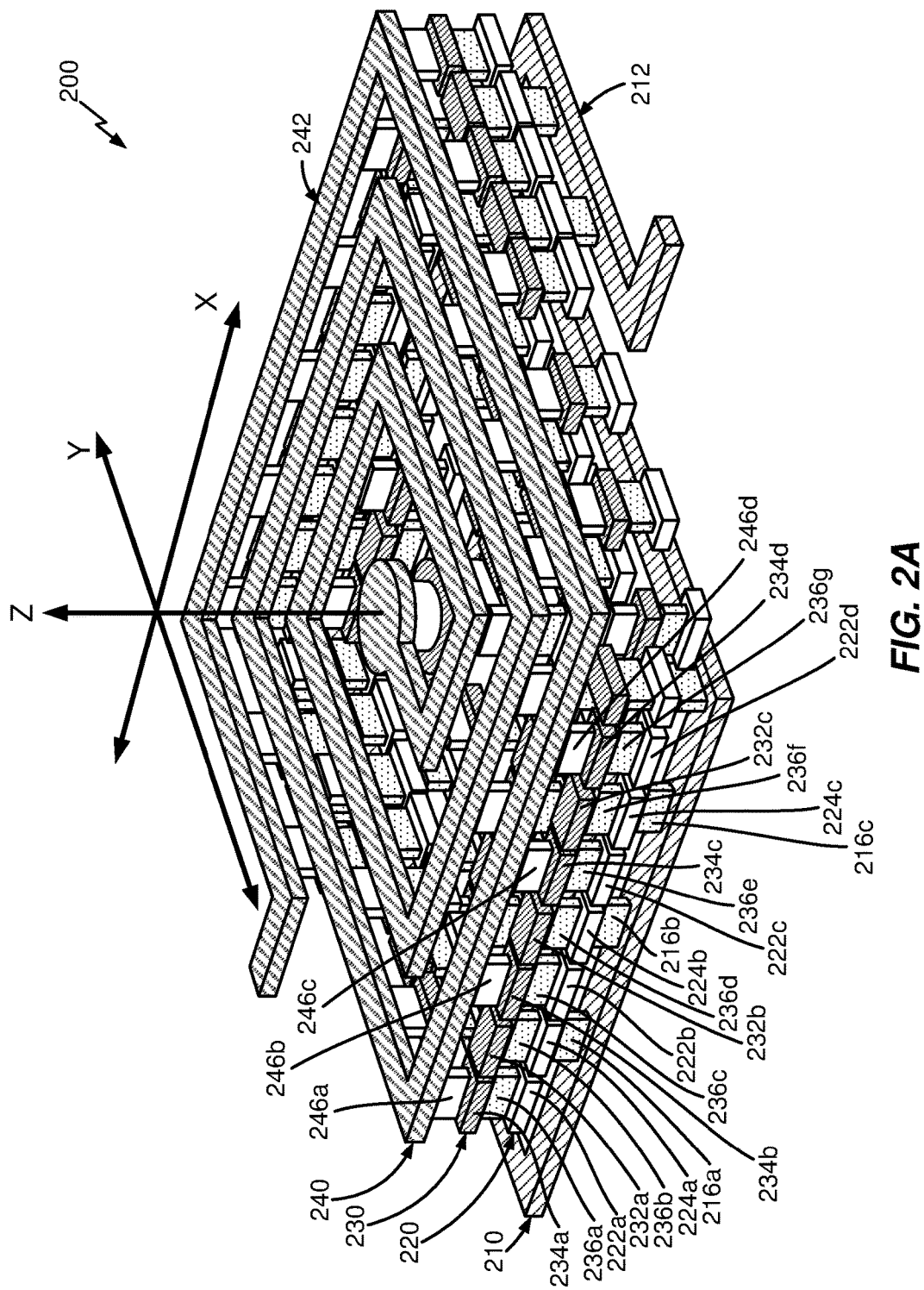
FIG. 2A-2F illustrates an inductor-capacitor in multiple views, on an X, Y, and Z axis.

FIG. 2A is an isometric view of an exemplary inductor-capacitor apparatus 200 from a side view, in the X, Y, and Z plane. Specifically, FIG. 2A illustrates the inductor-capacitor apparatus 200 including a plurality of stacked metal layers shaped configured in a spiral, the plurality of stacked metal layers including a first metal layer 210, the first metal layer including a first inductor 212, a second metal layer 220 including a plurality of first pads 222a, b, c, d, and a plurality of second pads 224a, b, c, a third metal layer 230 including a plurality of third pads 232a, b, c, and a plurality of fourth pads 234 a, b, c, d, and a fourth metal layer 240 including a second inductor 242. FIG. 2A further illustrates a plurality of first vias 216a, b, c configured to couple the first metal layer 210 to the second metal layer 220, a plurality of second vias 236a, b, c, d, e, f, g, configured to couple the second metal layer 220 to the third metal layer 230, and a plurality of third vias 246a, b, c, d, configured to couple the third metal layer 230 to the fourth metal layer 240. A dielectric layer 260 (not shown in FIG. 2A, but see FIGS. 2E, 3A, and 4G as examples), which may comprise more than one layer (this will be discussed further with respect to FIG. 4A-G), surrounds the plurality of stacked metal layers and the plurality of first vias 216a-c, second vias 236a-g, third vias 246a-g. Further details on how the inductor-capacitor apparatus 200 is electrically coupled and a capacitor 250 will be discussed shortly, with respect to FIG. 2E.

In one aspect, the first inductor 212 is not directly coupled to the second inductor 242, rather, the first inductor 212 and the second inductor 242 are configured to provide mutual inductance. FIG. 2A is a simplified illustration and not all interconnects are shown.

Each of the plurality of stacked metal layers, including the first metal layer 210, the second metal layer 220, the third metal layer 230, and the fourth metal layer are configured in a spiral shape and stacked together. For example, the fourth metal layer 240 including the second inductor 242 may be stacked over the third metal layer 230, the third metal layer 230 may be stacked over the second metal layer 220, and the second metal layer 220 may be stacked over the first metal layer 210 including the first inductor 212. There may be intermediate layers in between the plurality of stacked metal layers. In one aspect, the first inductor 212 (of the first metal layer 210) is configured in a first spiral shape and the second inductor 242 (of the fourth metal layer 240) is configured in a second spiral shape. In one aspect, the first inductor 212 and the second inductor 242 are stacked so that the first spiral shape and the second spiral shape at least partially mirror each other. The first spiral shape and the second spiral shape may be the same, or may mirror each other at least in part (e.g. see FIG. 2D).

In another aspect, the plurality of first vias 216a-c, the plurality of first pads 222a-d, the plurality of second pads 224a-c, the plurality of second vias 236a-g, the plurality of third pads 232a-c, the plurality of fourth pads 234a-d and the plurality of third vias 246a-d, are configured in a spiral shape similar to the first inductor 212 and the second inductor 242, and stacked to at least partially mirror the spiral shape of the first inductor 212 and the second inductor 242.

Figure 2B:
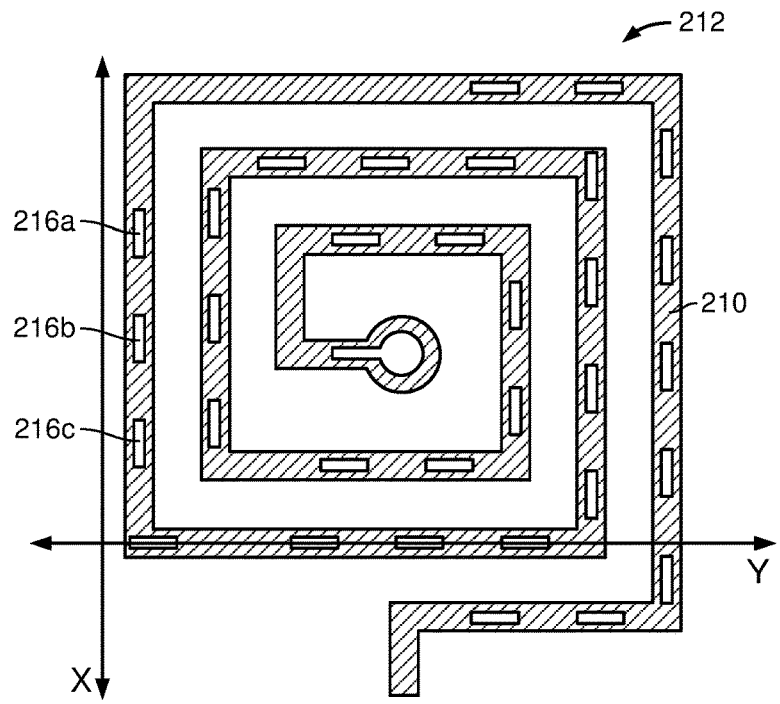
Figure 2C:
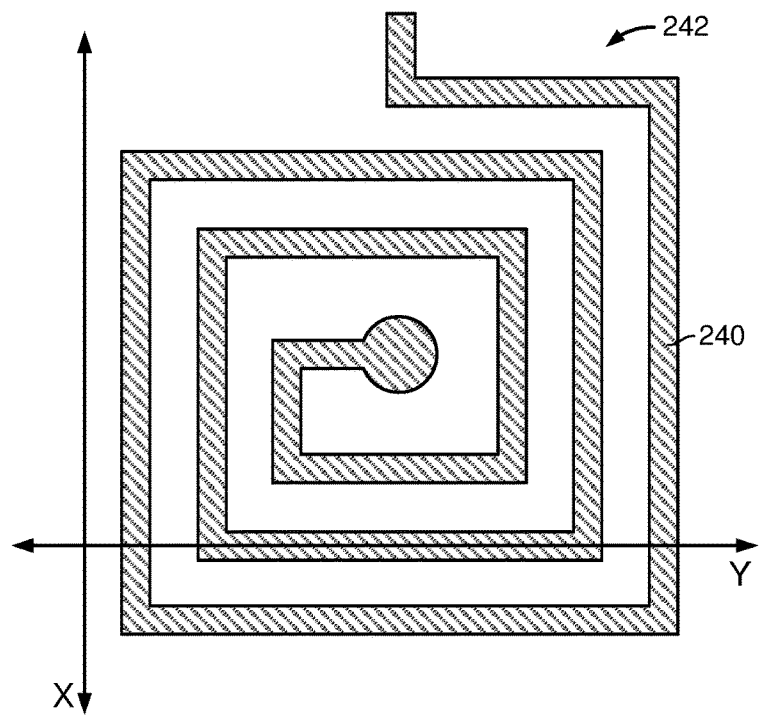
Figure 2D:
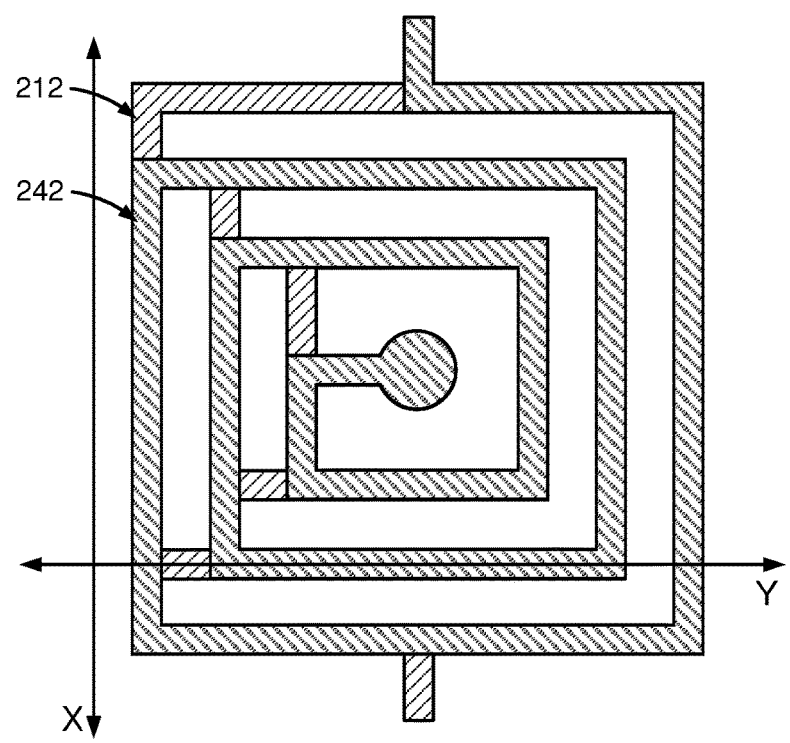
Figure 2E:
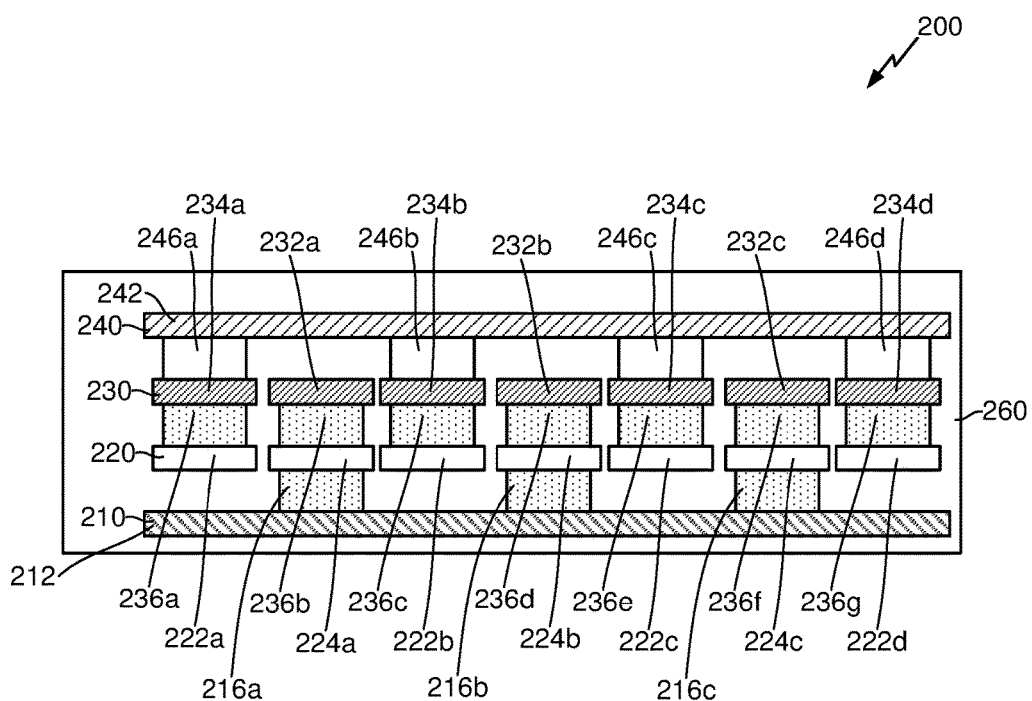

In one aspect, as illustrated in FIG. 2A and FIG. 2E, the inductor-capacitor apparatus 200 has four layers of metal, that is the first metal layer 210, the second metal layer 220, the third metal layer 230, and the fourth metal layer 240. However, this disclosure is not so limited. The inductor-capacitor 200 may have additional metal layers (not shown) and corresponding interconnects such as vias (not shown) in between the first inductor 212 (of the first metal layer 210) and the second inductor 242 (of the fourth metal layer 240). Such additional metal layers (not shown) may be configured to provide additional capacitance.

FIG. 2B illustrates the first inductor 212, separate from the inductor-capacitor apparatus 200, and from a top down view. In the top down view, the first inductor 212 is shown in the X, Y plane with the positive Z axis pointing out of the page. The first inductor 212 is illustrated with approximately three inductor loops. However, this disclosure is not so limited. The first inductor 212 may have more or less inductor loops to achieve the desired inductance. FIG. 2B illustrates the plurality of first vias 216a-c on the X plane. However, it will be understood that there may be more or less plurality of first vias 216a-c than what is illustrated. The number and spacing (e.g., area) of the plurality of first vias 216a-c may be designed depending on the amount of desired capacitance. In one aspect (not shown), the plurality of first vias (i.e., 216a-c and beyond) does not extend as far as the inductor loop of the first inductor 212. In other words, there may be a portion of the first inductor 212 that does not have any plurality of first vias such as 216a-c.

FIG. 2C illustrates the second inductor 242, separate from the inductor-capacitor apparatus 200, and from a top down view. In the top down view, the second inductor 242 is shown in the X, Y plane with the positive Z axis pointing out of the page. The second inductor 242 is illustrated with approximately three inductor loops. However, this disclosure is not so limited. The second inductor 242 may have more or less inductor loops to achieve the desired inductance. The first inductor 212 and the second inductor 242 may have the same number of inductor loops or may have a different number of loops. FIG. 2C illustrates the plurality of third vias 246a-d on the X plane. However, it will be understood that there may be more or less plurality of third vias 246a-d than what is illustrated. In one aspect, the plurality of third vias (i.e., 246a-d and beyond) do not extend as far as the inductor loop of the second inductor 242. In other words, there may be a portion of the second inductor 242 that does not have any plurality of third vias such as 246a-d.

FIG. 2D illustrates a top down view of the second inductor 242 imposed over the first inductor 212. As illustrated, the inductor loops of the first inductor 212 and the inductor loops of the second inductor 242 may mirror each other at least in part or in whole, and need not mirror each other exactly. The first inductor 212 and the second inductor 242 may have more or less loops than the other.

FIG. 2E illustrates the inductor-capacitor 200 in the X, Z plane with the positive Y axis pointing out of the page. FIG. 2E provides a view of the inductor-capacitor 200, where the electrical coupling of the inductor-capacitor and the capacitor 250 may be understood.

In one aspect, the inductor-capacitor apparatus 200 is configured to be electrically coupled as follows: the plurality of third vias 246a-d couple the second inductor 242 to the plurality of fourth pads 235a-d, and some of the plurality of second vias 236 a,c,e,g couple the plurality of fourth pads 235a-g to the plurality of first pads 222a-d. There is an absence of a conducting metal (e.g. a via), that is, there is a first electrical-open (not labeled), between the plurality of first pads 222a-d and the first inductor 212. In another aspect, the inductor-capacitor apparatus 200 is configured to be electrically coupled as follows: the plurality of first vias 216a-c couple the first inductor 212 to the plurality of second pads 224a-c, and some of the plurality of second vias 236 b,d,e couple the plurality of second pads 224a-c to the plurality of third pads 232a-c. There is an absence of a conducting metal (e.g. a via), that is, there is a second electrical open (not labeled), between the plurality of third pads 232a-c and the second inductor 242.

Figure 2F:
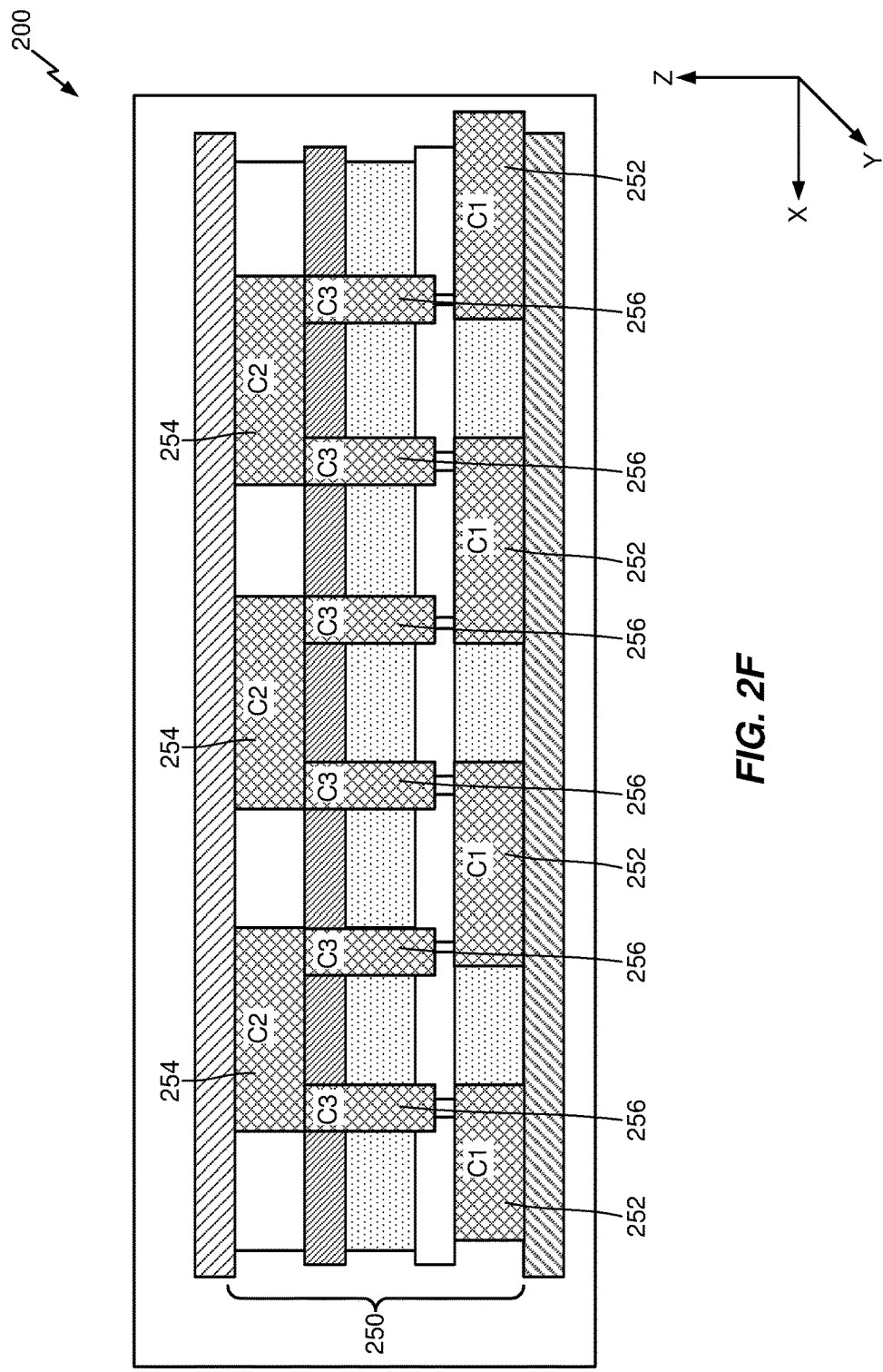

FIG. 2F illustrates an aspect of the inductor-capacitor apparatus 200 of FIG. 2E in the same view point, i.e., in the X, Z plane, except for illustrative purposes only, it is annotated to show the capacitor 250. In this aspect, a capacitor 250 is comprised of one or more of the following capacitors: a first capacitor 252, a second capacitor 254, and a third capacitor 256. Either the first capacitor 252, or the second capacitor 254, or both, may be formed of any one of the plurality of stacked metal layers (e.g., the first metal layer 210, the second metal layer 220, the third metal layer 230, the fourth metal layer 240) as a first electrode, and any other one of the plurality of stacked metal layers (e.g., the first metal layer 210, the second metal layer 220, the third metal layer 230, the fourth metal layer 240) as a second electrode, separated by the dielectric layer 260 (shown in FIG. 2E). It shall be understood that the capacitor, including the first capacitor 252, the second capacitor 254 and the third capacitor 256 extend through the X, Y and Z axis (although FIG. 2E illustrates the X,Y axis).

In one aspect, the first capacitor 252 includes at least a portion of the first inductor 212 or at least a portion of the first metal layer 210, and at least a one of the plurality of first pads (e.g., one of 222a-d), separated by the dielectric layer 260 (shown in FIG. 2E). That is, the absence of a conducting metal between the plurality of first pads 222a-d and the first inductor 212, permits the formation of the first capacitor 252. As a non-limiting example, the distance between a one of the plurality of first pads (e.g., one of 222a-d) and the opposite portion of the first inductor 212 is about 20-80 um. As another non-limiting example, the distance between a one of the plurality of first vias (e.g., 216a) and an adjacent another one of the plurality of first vias (e.g., 216b) is about 20-80 um. It will be understood, that the inductor-apparatus 200 may be designed with these distances in mind so that the desired capacitance may be achieved.

In another aspect, the second capacitor 254 includes at least a portion of the second inductor 242 or at least a portion of the fourth metal layer 240, and at least one of the plurality of third pads (e.g., one of 232a-c), separated by the dielectric layer 260. That is, the absence of a conducting metal (e.g. a via), between the plurality of third pads 232a-c and the second inductor 242, permits the formation of the second capacitor 252. As a non-limiting example, the distance between a one of the plurality of third pads (e.g., one of 232a-c) and the opposite portion of the second inductor 242 is about 20-80 um. As another non-limiting example, the distance between a one of the plurality of third vias (e.g., 246a) and an adjacent another one of the plurality of third vias (e.g., 246b) is about 20-80 um. It will be understood, that the inductor-apparatus 200 may be designed with these distances in mind so that the desired capacitance may be achieved.

In another aspect, the third capacitor 256 includes at least one of a plurality of third pads (e.g., one of 232a-c), and at least one of a plurality of second vias (e.g., one of 236b, 236d, 236f), and a one of a plurality of fourth pads (e.g., one of 234a-d) and at least one of a plurality of second vias (e.g., one of 236a, 236c, 236d), separated by the dielectric layer 260 (shown in FIG. 2E). That is, the electrical open between at least one of a plurality of third pads (e.g., one of 232a-c), and at least one of a plurality of second vias (e.g., one of 236b, 236d, 236f), and a one of a plurality of fourth pads (e.g., one of 234a-d) and at least one of a plurality of second vias (e.g., one of 236a, 236c, 236d) permits the formation of the third capacitor 256. As a non-limiting example, the distance between a one of the plurality of fourth pads (e.g., 234a-d) and an adjacent one of the plurality of third pads (e.g., 232a-c) is about 5-20 um. As another non-limiting example, the distance between a one of the plurality of third vias (e.g., 246a-d) and an adjacent one of the plurality of third vias (e.g., 246a-d) is about 5-20 um. It will be understood, that the inductor-apparatus 200 may be designed with these distances in mind so that the desired capacitance may be achieved.

Exemplary Substrate Comprising an Inductor-Capacitor Apparatus

Figure 3A:
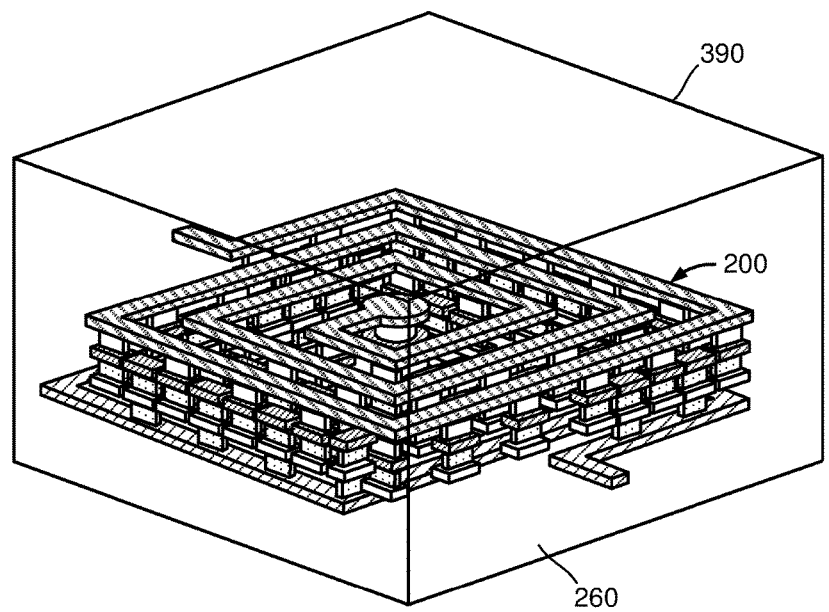
FIG. 3A illustrates an inductor-capacitor apparatus embedded or integrated in a substrate.

FIG. 3A is an isometric view of the inductor-capacitor apparatus 200 of FIG. 3A-D, embedded or integrated in a substrate 390. In one aspect, the substrate 390 may comprise a package substrate, (including a core or coreless), an interposer (e.g., silicon or glass), a ceramic package, an integrated circuit, or a printed circuit board (PCB). In one aspect, the substrate 390 may be a device that includes the inductor-capacitor apparatus 200 as well as other components or structures such as other interconnects (e.g., interconnects for electrical coupling such as metal layers, pads, traces, vias), or passive devices (e.g., inductors, capacitors, resistors), or active devices (e.g., die, transistors). The substrate 390 may include the dielectric layer 260 which may comprise multiple layers (discussed later). It will be understood that although FIG. 3A illustrates two inductors (i.e., the first inductor 212 and the second inductor 242) there may be additional inductors (not shown). In another aspect, the inductor-capacitor apparatus 200 may be stacked on another structure similar to the inductor-capacitor apparatus 200.

Figure 3B:
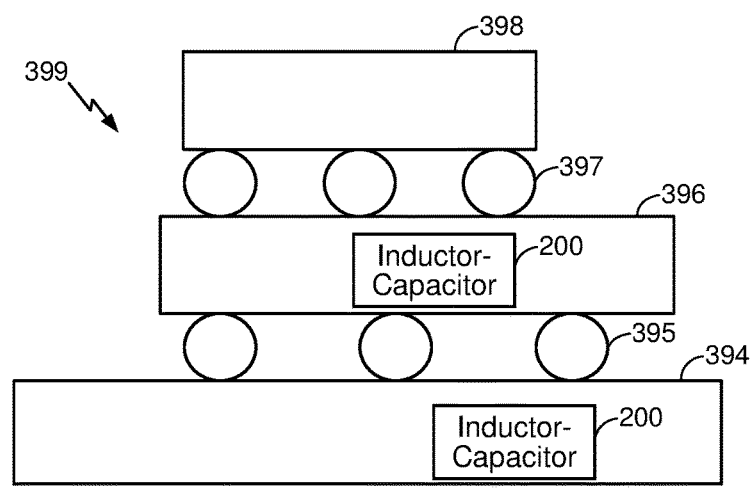
FIG. 3B illustrates an inductor-capacitor apparatus in an exemplary structure.

FIG. 3B illustrates the inductor-capacitor apparatus 200 in an exemplary structure 399. Specifically, FIG. 3B illustrates a die 398, coupled by interconnects 397 to a package substrate or interposer 396. The inductor-capacitor apparatus 200 is embedded or integrated into the package substrate or interposer 396. The package substrate or interposer 396 is coupled through interconnects 395 to a PCB 394. The inductor-capacitor apparatus 200 is embedded or integrated into PCB 394.

In comparing FIG. 3B to the traditional FIG. 1, FIG. 3B illustrates a space savings in the X and Y plane (i.e. a lateral space savings) by embedding or integrating the inductor-capacitor 200 into the substrate 390. When a plurality of inductors and capacitors are required for the desired application, the space savings is increased. Moreover, cost savings may be achieved in that the component costs of the inductor 110 and capacitor 112 are avoided.

Exemplary Sequence for Manufacturing an Inductor-Capacitor Apparatus

In some implementations, manufacturing an inductor apparatus includes several processes. FIG. 4 (which includes FIGS. 4A-4G) illustrates an exemplary sequence for manufacturing an inductor-capacitor apparatus 400 (see FIG. 4G). The inductor-capacitor 400 may be embedded or integrated into a substrate, such as substrate 390. The inductor-capacitor apparatus 400 may be three dimensional in that it may have aspects in the X, Y, and Z axis. The sequence is illustrated using cross-section views, in the X, Z plane. In some implementations, the sequence of FIGS. 4A-4G may be used to manufacture the inductor-capacitor apparatus 200 (including the first inductor 212, the second inductor 242, and the capacitor 250) integrated in the substrate 390. It should be noted that the sequences shown in FIGS. 4A-4G may be combined to simplify and clarify the sequence. In some implementations, the order of the sequences may be changed or modified.

Figure 4A:
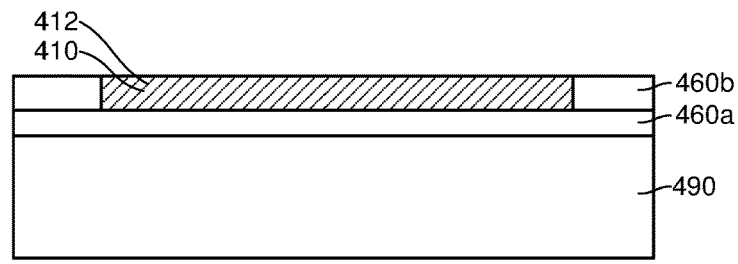
FIG. 4A-4G illustrates an exemplary sequence for manufacturing an inductor-capacitor apparatus.

FIG. 4A illustrates a carrier 490, where the carrier 490 may be a carrier wafer such as a package, or an active wafer such as an integrated circuit. A dielectric layer 460 shown in FIG. 4G comprises dielectric portions including 460a, 460b, 460c, 460d, 460e, 460f, 460g, and 460h as will be discussed shortly. FIG. 4A illustrates dielectric portion 460a deposited over the carrier 490, and dielectric portion 460b deposited over dielectric portion 460a. A first metal layer 410, including a first inductor 412 is patterned in dielectric portion 460b. Patterning may include providing a photo resist layer (not shown) on areas where the metal patterning is not desired and then depositing a metal so that the desired pattern is formed. Although not shown in this view, the first inductor 410 is formed in a spiral shape (e.g., see FIG. 2A). The first inductor 412 may be the same as first inductor 212.

Figure 4B:
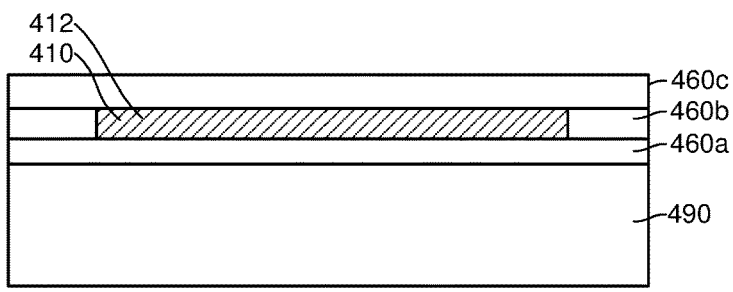

FIG. 4B illustrates dielectric portion 460c deposited over dielectric portion 460b and over the first metal layer 410 including over the first inductor 412.

Figure 4C:
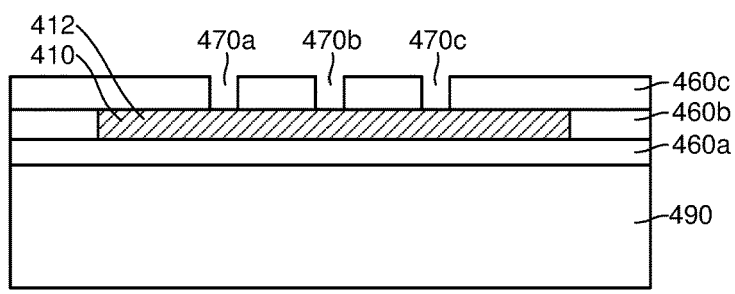

FIG. 4C illustrates a plurality of via holes 470 including 470a, 470b and 470c formed in the dielectric portion 460c.

Figure 4D:
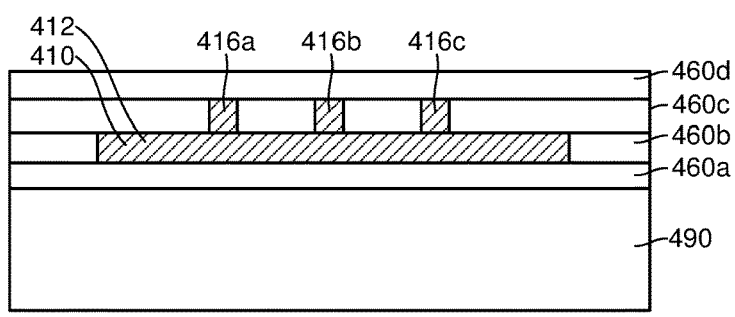

FIG. 4D illustrates a plurality of first vias 416a, b, c after the via holes 470a-c have been filled with conductive material. The plurality of first vias 416a-c are spaced apart laterally. Because the first inductor 412 (or the first metal layer 410) acts as an electrode of the first capacitor 252 (see FIG. 2F), the lateral spacing between the plurality of first vias 416a-c may impact the size of the first capacitor 252 (see FIG. 2F) by exposing more or less of the first inductor 412 being. The portion of the first inductor 412 between the plurality of first vias 416a-c, was discussed with respect to FIG. 2F in terms of an absence of a conducting metal (e.g. a via), or a first electrical-open. FIG. 4C further illustrates dielectric portion 460d deposited over dielectric portion 460c and the plurality of first vias 416a-c. The plurality of first vias 416a-c may, for example, form the plurality of first vias 216a-c.

Figure 4E:
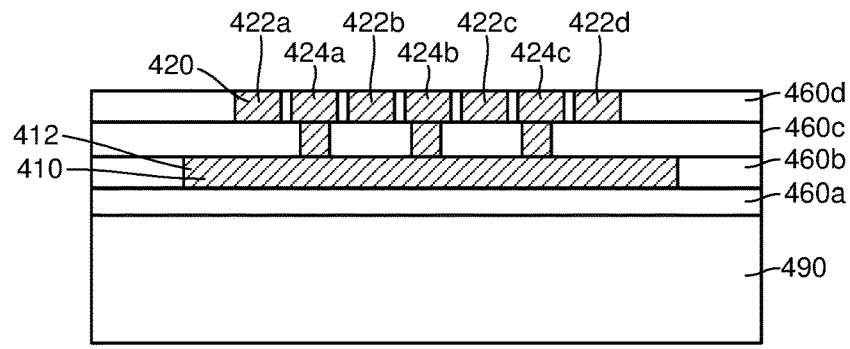

FIG. 4E illustrates patterning of the second metal layer 420 in the dielectric portion 460d, including patterning of a plurality of first pads 422a, 422b, 422c, 422d where the plurality of first pads 422a-d are not electrically coupled to the first inductor 412. The absence of a conducting metal between the plurality of first pads 422a-d and the first inductor 412, permits the formation of the capacitor. A plurality of second pads 424a, 424b, 424c are illustrated, where the plurality of second pads are electrically coupled to the plurality of first vias 416a-c respectively.

Figure 4F:
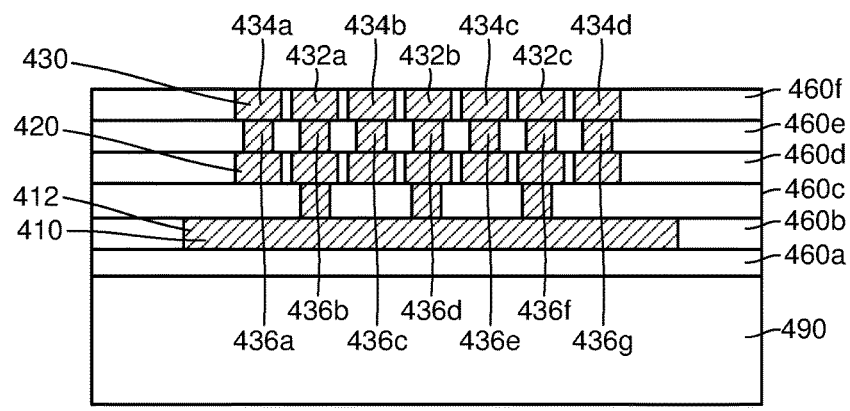

FIG. 4F illustrates deposition of dielectric portion 460e over dielectric portion 460d and over the second metal layer 420. A plurality of second vias 436a-g are formed by filling a plurality of second via holes (not labeled) in the dielectric portion 460e, with a conducting material. A dielectric portion 460f is deposited over dielectric portion 460e and over the plurality of second vias 436a-g. A third metal layer, 430 is patterned in the dielectric portion 460f, including the plurality of third pads 432a-c and the plurality of fourth pads 434a-d. The plurality of second vias 436 a,c,e,g are configured to couple the plurality of first pads 422a-d to the plurality of fourth pads 434a-d, respectively. The plurality of second vias 432b,d,f are configured to couple the plurality of second pads 424a-c to the plurality of third pads 432a-c, respectively.

Each one of the plurality of third pads 432a-c may be laterally spaced apart from each one of the plurality of fourth pads 434a-d, and each one of the plurality of second vias 436b, 436d, 436f may be laterally spaced apart from the other plurality of second vias 436a, 436c, 436d. The electrical open between at least one of a plurality of third pads (e.g., one of 432a-c), and at least one of a plurality of second vias (e.g., one of 436b, 436d, 436f), and a one of a plurality of fourth pads (e.g., one of 434a-d) and at least one of a plurality of second vias (e.g., one of 436a, 436c, 436d) permits the formation of capacitors. For example, one of a plurality of third pads 432a coupled to one of a plurality of second vias 436a may act as an electrode of a capacitor. Similarly, one of a plurality of fourth pads 434a coupled to one of a plurality of second vias 236a may act as another electrode of a capacitor. These electrodes are separated by the dielectric layer 460.

Figure 4G:
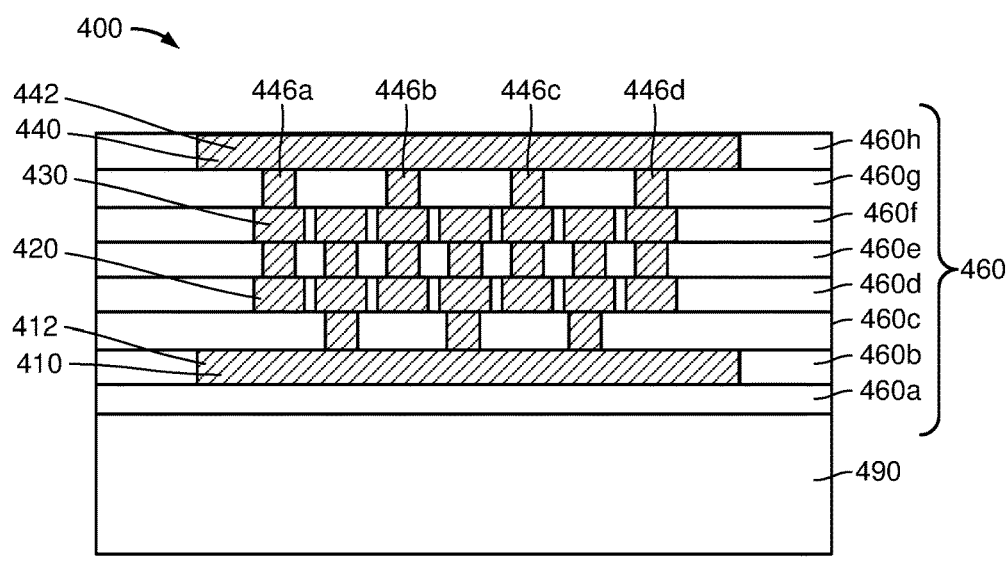

FIG. 4G illustrates dielectric portion 460g deposited over dielectric portion 460f. A plurality of third vias 446a-d are formed in the dielectric portion 460g. A dielectric portion 460h is deposited over dielectric portion 460g. A fourth metal layer 440, including a second inductor 442 is patterned in dielectric portion 460h. The plurality of third vias 446a-d are configured to electrically couple the plurality of fourth pads 434a-d respectively, to the second inductor 442 (of the fourth metal layer 440). The lateral spacing between the plurality of third vias 446*a-d* may impact the size of the second capacitor 254 (see FIG. 2F) by exposing more or less of the second inductor 442 (i.e. where the second inductor 442 acts as an electrode of the second capacitor 254).

Figure 5:
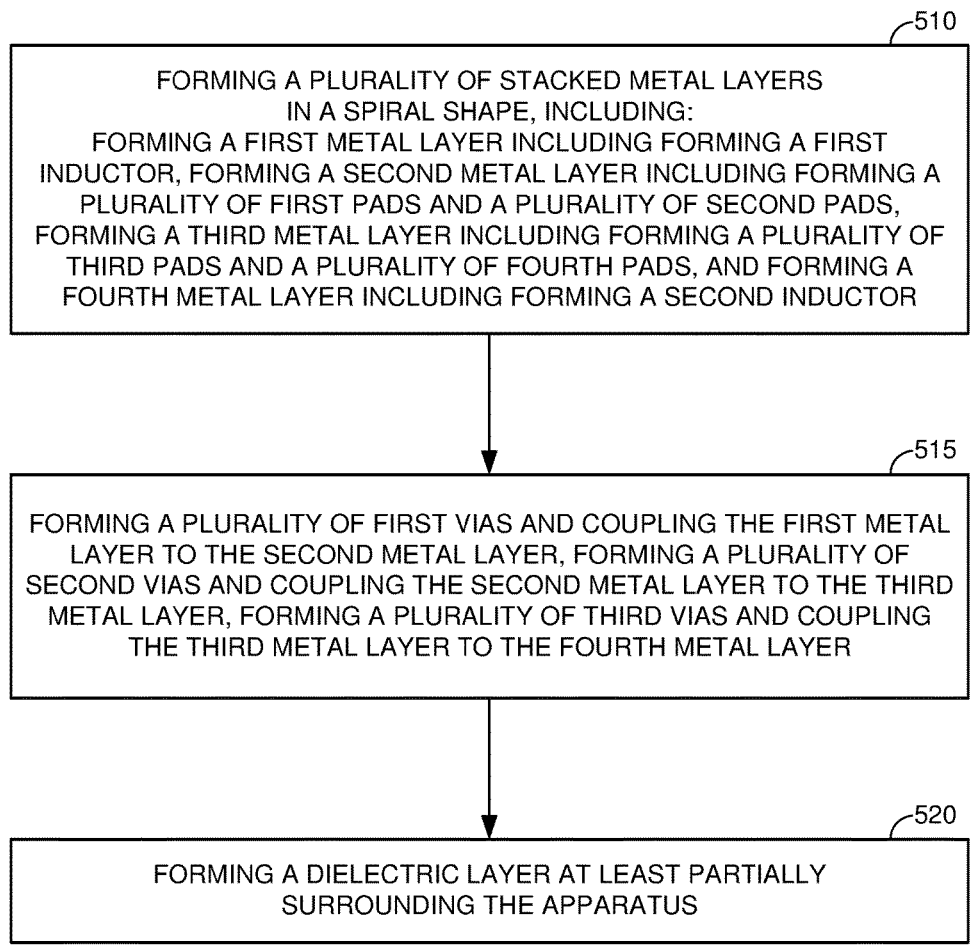
FIG. 5 illustrates an exemplary flow diagram of a high level method for manufacturing an inductor-capacitor apparatus.

Exemplary Flow Diagram of a Method for Manufacturing an Inductor-Capacitor Apparatus FIG. 5 illustrates an exemplary flow diagram of a high level method for manufacturing an inductor-capacitor apparatus. It should be noted that for the purpose of clarity and simplification, the flow diagram of FIG. 5 does not necessarily include all the steps of manufacturing an inductor apparatus. Moreover, in some instances, several steps may have been combined into a single step to simplify the description of the sequences.

As shown in FIG. 5, the method includes forming (at step 510) a plurality of stacked metal layers in a spiral shape, including, a forming a first metal layer (e.g., 210, 410) including forming a first inductor (e.g., 212, 412), forming a second metal layer (e.g., 220, 420) including forming a plurality of first pads (e.g. 222*a-d*, 422*a-d*) and a plurality of second pads (e.g., 224*a-c*, 424*a-c*), forming a third metal layer (e.g. 230, 430) including forming a plurality of third pads (e.g., 232*a-c*, 432*a-c*) and a plurality of fourth pads (e.g., 234*a-d*, 434*a-d*), and forming a fourth metal layer (e.g., 240, 440) including forming a second inductor (e.g., 242, 442).

Further, the method includes forming (at step 515) a plurality of first vias (e.g., 216*a-c*, 416*a-c*) and coupling the first metal layer (e.g., 210, 410) to the second metal layer (e.g., 220, 420) forming a plurality of second vias (e.g., 236*a-g*, 436*a-g*) and coupling the second metal layer (e.g., 220, 420) to the third metal layer (e.g., 230, 430), forming a plurality of third vias (e.g., 246*a-d*, 446*a-d*) and coupling the third metal layer (e.g., 230, 430) to the fourth metal layer (e.g., 240, 440).

The method further includes forming a dielectric layer (e.g., 260, 460) at least partially surrounding the apparatus)

Exemplary Applications Including an Inductor-Capacitor Apparatus

As discussed previously, the inductor-capacitor apparatus 200, (including where the inductor-capacitor 200 is integrated into substrate 390) has the advantage of cost savings, and the advantage of space savings in the X Y plane. It will be understood that the inductor-capacitor apparatus 200 may be used in any application, device or structure having need for an inductor and a capacitor, or having reduced size requirements. The inductor-capacitor apparatus 200 may also advantageously be used in radio-frequency (RF) applications. In one aspect, the inductor-capacitor apparatus 200 may be configured as an L-C circuit or resonant circuit and may be utilized in any application where it is useful to lower the self-resonance of the L-C circuit.

Figure 6A:
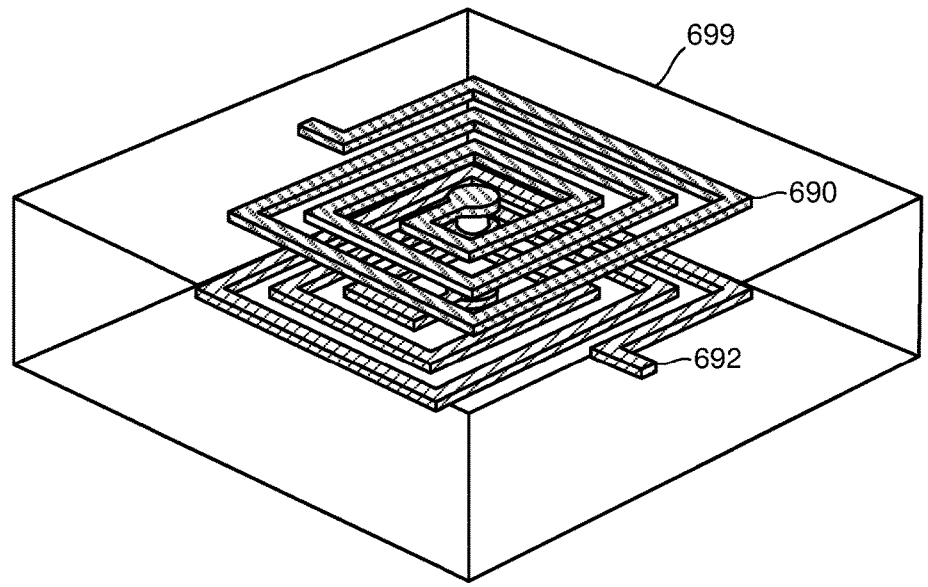
FIG. 6A-6C illustrates an inductor-capacitor apparatus having a lowered self-resonance as compared with an inductor without an integrated capacitive structure.

FIG. 6A illustrates a device 699 including a first spiral inductor 690 having a length X1, and a second spiral inductor 692 having a length X2, where X1+X2=X', the total inductor length of device 699. The device 699 does not have a capacitor integrated into the inductor.

Figure 6B:
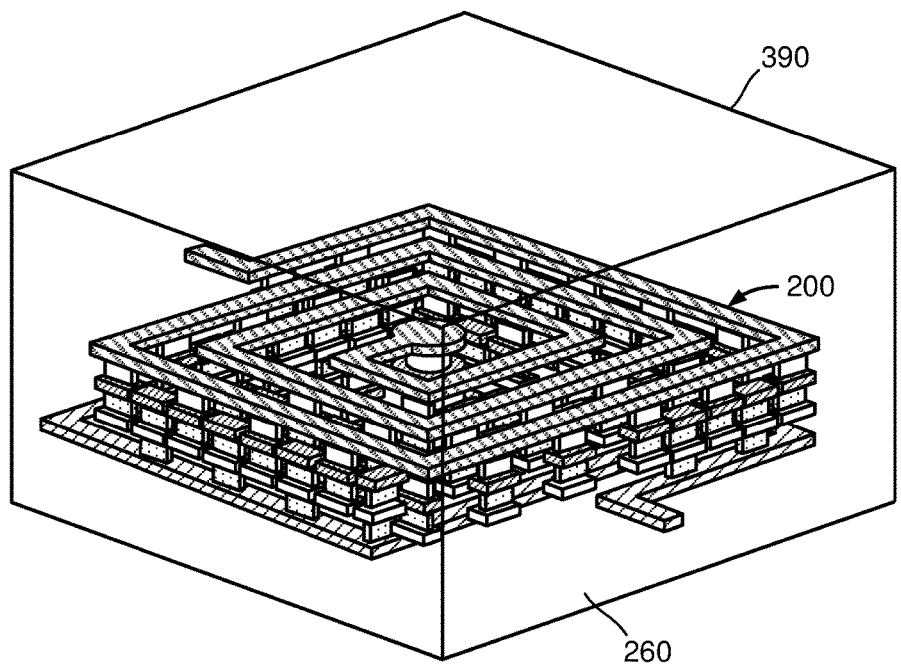

FIG. 6B illustrates inductor-capacitor apparatus 200 integrated into substrate 390, including the first inductor 212 having a length X1, and the second inductor 242 having a length X2, where X1+X2=X', the total inductor length of inductor-capacitor apparatus 200. Accordingly, the total inductor length of the inductor-capacitor apparatus 200 is the same as the total inductor length of device 699, and therefore both total inductor lengths contribute the same inductance (e.g. Y nH) at low frequencies.

Figure 6C:
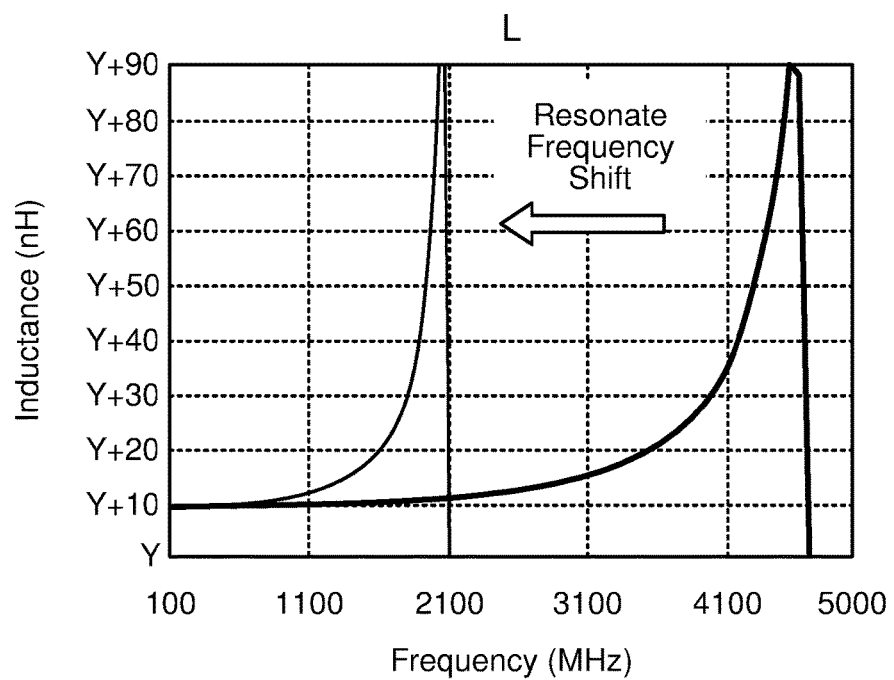

FIG. 6C is a graph of frequency versus inductance. The numbers shown are exemplary only. That is, other frequency ranges may be used according to the desired amount of inductance, capacitance and resonant frequency. Furthermore, the graph in FIG. 6C illustrates inductance measured in units of Henry on the Y axis, where the units shown are exemplary only. In one aspect, the lowest inductance value Y may correspond with an 0 nH, and Y+10 may correspond with 10 nH. However, it will be understood that another range of Y may be used according to the desired amount of inductance (and the corresponding total inductor length of inductor-capacitor apparatus 200 or of device 699).

In the example shown in FIG. 6C, the total inductance of the inductor-capacitor apparatus 200 and the total inductance of device 699 at frequencies below 100 MHz is Y. However, as shown in FIG. 6C, the resonant frequency for the device 699 (not having the benefit of the capacitor 250) is much higher, relative to the resonant frequency of the inductor-capacitor apparatus 200 even though both have the same total inductor length. In one aspect, the lower resonant frequency of 2100 MHz may be obtained by the inductor-capacitor 200 by designing the inductor-capacitor 200 with sufficient capacitance (e.g. capacitor 250, first capacitor 252, second capacitor 254, and third capacitor 256) to bring in, or reduce the resonant frequency. Moreover, the resonant-frequency of the inductor-capacitor 200 is much sharper. In comparison, the graph of FIG. 6C illustrates that the resonant frequency of the device 699 is much higher (e.g. at around 4500 MHz), and is not as sharp.

As examples, the characteristics of the inductor-capacitor 200 may lend itself for use as a narrow bandpass filter to select a single frequency from a composite signal or in an electronic oscillator to generate sinusoidal signals.

Figure 7A:
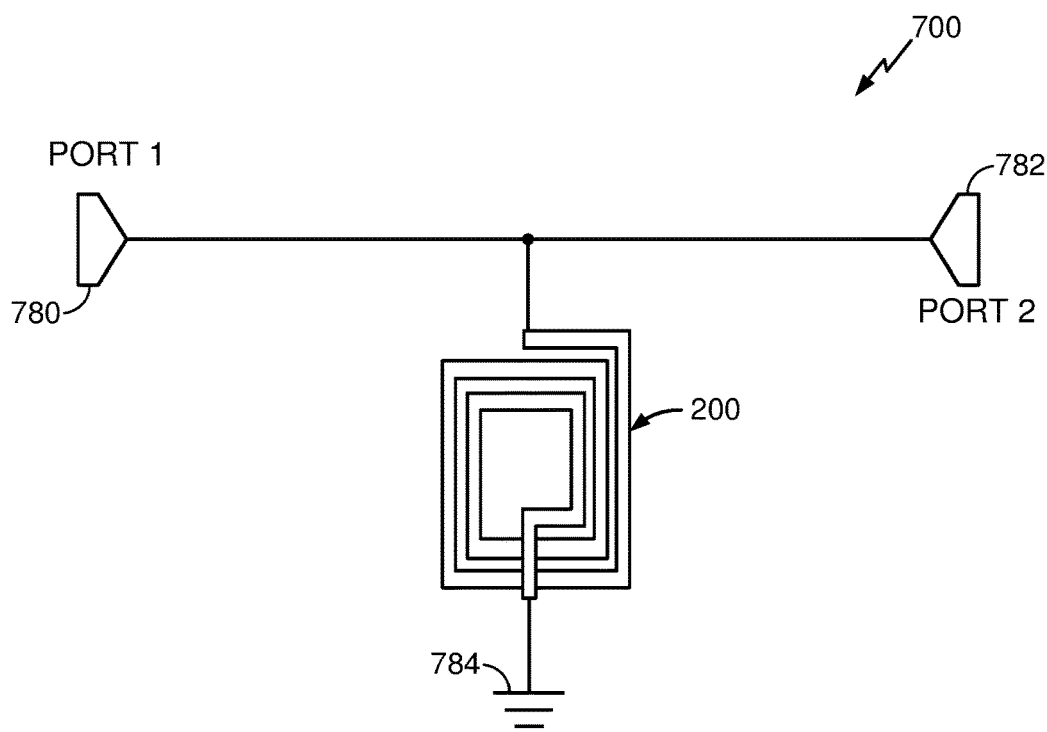
FIGS. 7A and 7B illustrate the inductor-capacitor apparatus implemented as part of a bandpass filter.
Figure 7B:
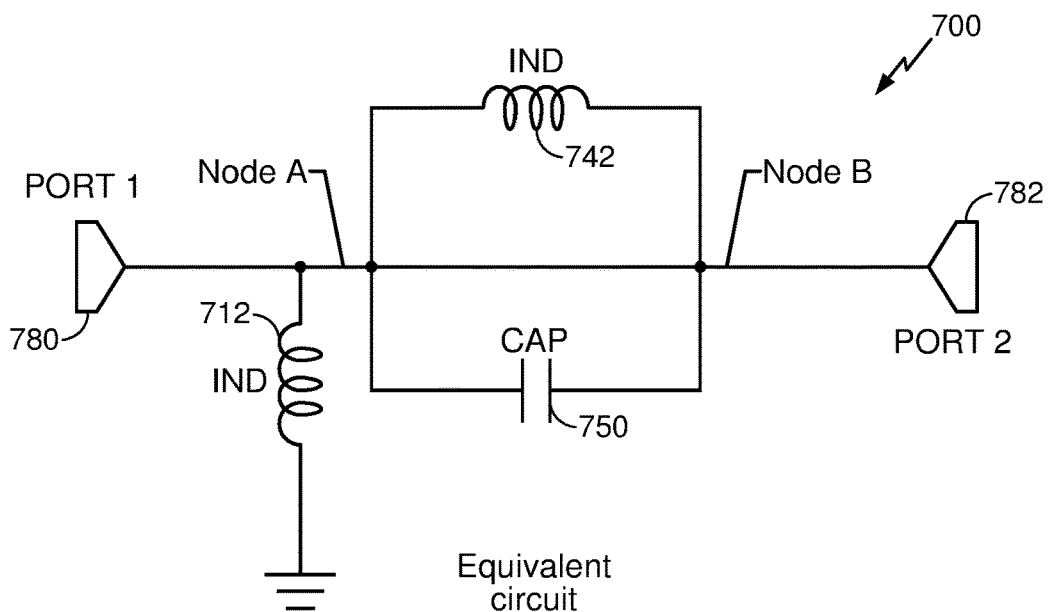

FIGS. 7A and 7B illustrate the inductor-capacitor apparatus 200 (including where the inductor-capacitor 200 is integrated into substrate 390) implemented as part of a bandpass filter 700. In one aspect, the bandpass filter 700 may be designed to pass signals at all frequencies, and block second harmonic frequencies. Specifically, FIG. 7A illustrates the inductor-capacitor apparatus 200 coupled to a first port 780, a second port 782 and to ground 784. FIG. 7B illustrates an equivalent circuit 730, including the first port 780 and the second port 782. A first inductor 712 is coupled to both the output of the first port 780 and to ground 784. The first inductor 712 may be like the first inductor 212 and 412. A second inductor 742 is coupled in parallel to a capacitor 750, and includes node A and node B. The second inductor 742 may be like the first inductor 212 and 412, and the capacitor 750 may be like capacitor 250 which may be an equivalent capacitance including other capacitors (e.g., first capacitor 252, second capacitor 254 and third capacitor 256). Node A is coupled to the first port 780, and node B is coupled to the second port 782. As previously explained, because the inductor-capacitor apparatus 200 has a resonant-frequency that is much sharper (e.g., as compared to device 699), bandpass filter 700 is able to allow desired signals to pass through the bandpass filter 700, while sharply blocking signals at unwanted frequencies such as the second harmonic frequencies. Moreover, the inductor-capacitor apparatus 200 is smaller and cheaper.

Figure 8A:
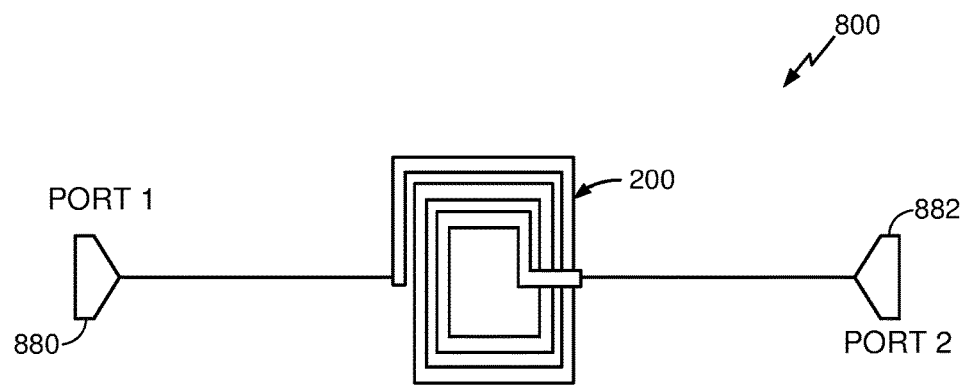
FIGS. 8A and 8B illustrate the inductor-capacitor apparatus implemented as part of a radio frequency choke.
Figure 8B:
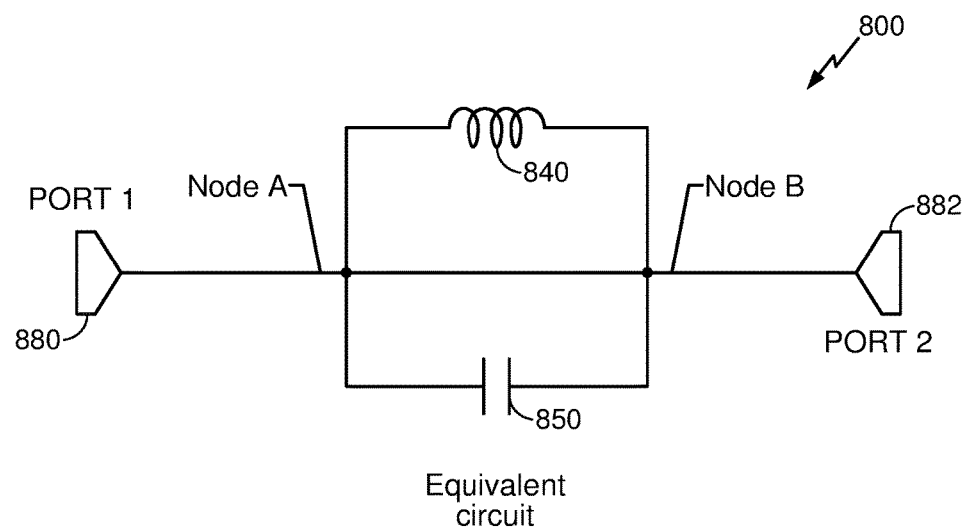

FIGS. 8A and 8B illustrate the inductor-capacitor apparatus 200 (including where the inductor-capacitor 200 is integrated into substrate 390) implemented as part of a radio frequency (RF) choke 800. In one aspect, the RF choke 800 may be designed to allow direct current (DC) at a desired frequency and to block (e.g., choke) alternating current (AC) at other frequencies. Specifically, FIG. 8A illustrates the inductor-capacitor apparatus 200 coupled to a first port 880, and a second port 882. FIG. 8B illustrates an equivalent circuit 800, including the first port 880 and the second port 882. An inductor 840 is coupled in parallel to a capacitor 850, and includes node A and node B. The inductor 840 has an inductance equal to the inductance of the first inductor 212, the second inductor 242 and the mutual inductance of the first inductor 212 and the second inductor 242. The capacitor 850 may be like capacitor 250 which may be an equivalent capacitance including other capacitors (e.g., first capacitor 252, second capacitor 254 and third capacitor 256). Node A is coupled to the first port 880, and node B is coupled to the second port 882. As previously explained, because the inductor-capacitor apparatus 200 has a resonant-frequency that is much sharper (e.g., as compared to device 699), RF choke 800 is able to allow desired DC signals to pass through, while sharply blocking AC signals. Moreover, the inductor-capacitor apparatus 200 is smaller and cheaper.

Exemplary Electronic Devices

Figure 9:
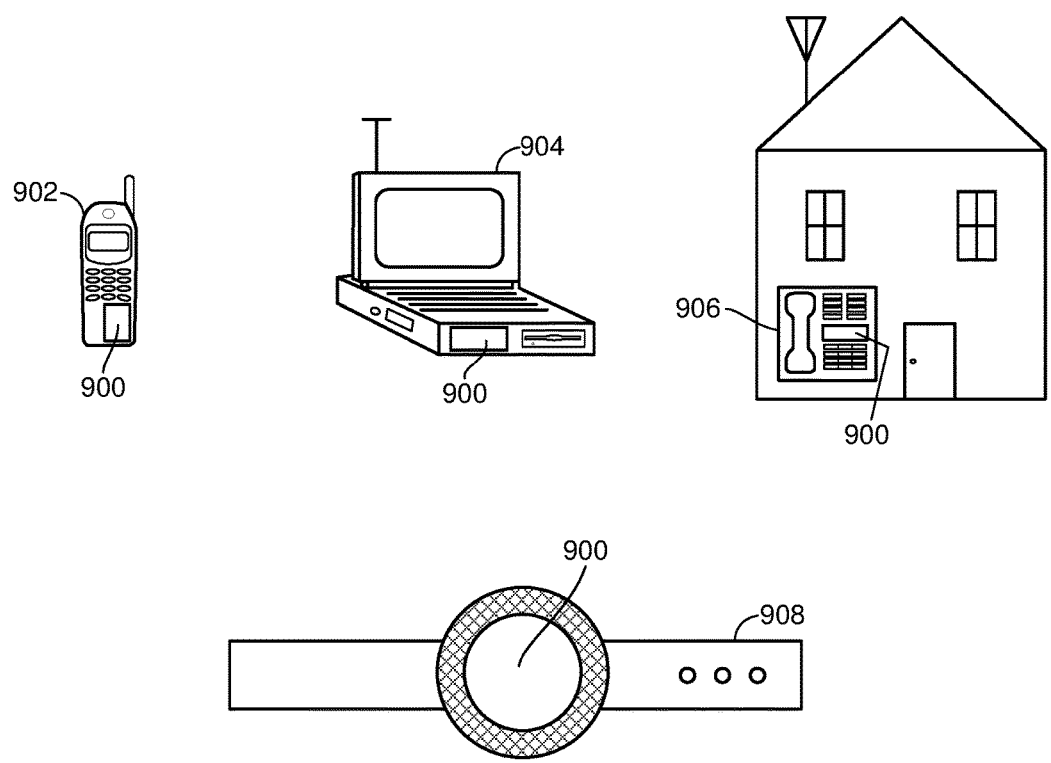
FIG. 9 illustrates various electronic devices that may include the various substrates, integrated devices, integrated device packages, semiconductor devices, dies, integrated circuits, packages, or inductors described herein.

FIG. 9 illustrates various electronic devices that may be integrated with any of the aforementioned substrate, integrated device, semiconductor device, integrated circuit, die, interposer, package, or inductor-capacitor apparatus. For example, a mobile phone device 902, a laptop computer device 904, a fixed location terminal device 906, a wearable device 908 may include an integrated device 900 as described herein. The integrated device 900 may be, for example, any of the substrate, integrated circuits, dies, integrated devices, integrated device packages, integrated circuit devices, device packages, integrated circuit (IC) packages, package-on-package devices described herein. The devices 902, 904, 906, 908 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2E-F through FIG. 8 may be rearranged and/or combined into a single component, process, feature or function or embodied in several components, processes, or functions. Additional elements, components, processes, and/or functions may also be added without departing from the disclosure. It should also be noted that FIGS. 3A-D through FIG. 8B and its corresponding description in the present disclosure is not limited to substrates. In some implementations, FIGS. 3A-D through FIG. 8B and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. The various aspects of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a plurality of stacked metal layers, including:
   a first metal layer including a first inductor, the first inductor configured in a spiral shape;
   a second metal layer including a plurality of first pads and a plurality of second pads;
   a third metal layer including a plurality of third pads and a plurality of fourth pads;
   a fourth metal layer including a second inductor, the second inductor configured in a spiral shape;
   a plurality of first vias configured to couple the first metal layer to the second metal layer;
   a plurality of second vias configured to couple the second metal layer to the third metal layer;
   a plurality of third vias configured to couple the third metal layer to the fourth metal layer;
   a dielectric layer at least partially surrounding the apparatus; and
   a first capacitor, wherein the first capacitor includes at least a portion of the first metal layer, and at least one of the plurality of first pads, separated by the dielectric layer.

2. The apparatus of claim 1, further comprising:
   a second capacitor, wherein the second capacitor includes one of a plurality of third pads and one of the plurality of second vias, and one of a plurality of fourth pads and a second one of a plurality of second vias, separated by the dielectric layer.

3. The apparatus of claim 1, further comprising:
   a second capacitor and a third capacitor, where the first capacitor, the second capacitor, and the third capacitor have an equivalent capacitance.

4. The apparatus of claim 1, wherein the plurality of first vias is offset from the plurality of third vias.

5. The apparatus of claim 1, wherein the apparatus is integrated into a device selected from the group consisting of a package substrate, an interposer, a ceramic package, an integrated circuit, and a printed circuit board.

6. The apparatus of claim 1, wherein the at least a portion of the first metal layer is at least a portion of the first inductor.

7. The apparatus of claim 1, further comprising:
a second capacitor, wherein the second capacitor includes at least a portion of the fourth metal layer, and at least one of the plurality of third pads, separated by the dielectric layer.

8. The apparatus of claim 7, further comprising wherein the at least a portion of the fourth metal layer is at least a portion of the second inductor.

9. The apparatus of claim 7, further comprising:
a third capacitor, wherein the third capacitor includes one of a plurality of third pads and one of the plurality of second vias, and one of the plurality of fourth pads and a second one of the plurality of second vias, separated by the dielectric layer.

10. The apparatus of claim 1, further comprising:
wherein the plurality of first vias couple the first inductor to the plurality of second pads; and
wherein the plurality of third vias couple the second inductor to the plurality of fourth pads.

11. The apparatus of claim 10, further comprising:
wherein the plurality of second vias couple the plurality of fourth pads to the plurality of first pads, and wherein the plurality of second vias couple the plurality of third pads to the plurality of second pads.

12. The apparatus of claim 1, wherein the first inductor and the second inductor are stacked so that the spiral shape of the first inductor and the spiral shape of the second inductor at least partially mirror each other.

13. The apparatus of claim 12, wherein the plurality of first vias, the plurality of first pads, the plurality of second pads, the plurality of second vias, the plurality of third pads, the plurality of fourth pads and the plurality of third vias are configured in the spiral shape and stacked to at least partially mirror the spiral shape of the first inductor and second inductor.

14. The apparatus of claim 1, wherein the first inductor and the second inductor are configured to provide mutual inductance.

15. The apparatus of claim 1, wherein the dielectric layer comprises a plurality of dielectric layers.

16. The apparatus of claim 1, wherein the apparatus is an LC resonant circuit.

17. The apparatus of claim 1, wherein the apparatus further comprises a device selected from the group consisting of: a resonant circuit, a radio frequency choke, and band-pass filter.

18. A method of fabricating an apparatus comprising:
forming a plurality of stacked metal layers, including:
forming a first metal layer including forming a first inductor in a spiral shape;
forming a second metal layer including forming a plurality of first pads and a plurality of second pads;
forming a third metal layer including forming a plurality of third pads and a plurality of fourth pads;
forming a fourth metal layer including forming a second inductor in a spiral shape;
forming a plurality of first vias and coupling the first metal layer to the second metal layer;
forming a plurality of second vias and coupling the second metal layer to the third metal layer;
forming a plurality of third vias and coupling the third metal layer to the fourth metal layer;
forming a dielectric layer at least partially surrounding the apparatus; and
forming a first capacitor, wherein the first capacitor includes at least a portion of the first metal layer, and at least one of the plurality of first pads, separated by the dielectric layer.

19. The method of claim 18, further comprising:
stacking the first inductor and the second inductor so that the spiral shape of the first inductor and the spiral shape of the second inductor at least partially mirror each other.

20. The method of claim 19, further including forming the plurality of first vias, the plurality of first pads, the plurality of second pads, the plurality of second vias, the plurality of third pads, the plurality of fourth pads and the plurality of third vias in the spiral shape and stacking them to at least partially mirror the spiral shape of the first inductor and second inductor.

21. The method of claim 18 further comprising:
forming a second capacitor, wherein the second capacitor is formed of one of a plurality of third pads and one of the plurality of second vias, and one of a plurality of fourth pads and a second one of a plurality of second vias, separated by the dielectric layer.

22. The method of claim 18, further comprising forming the plurality of first vias so they are offset from the plurality of third vias.

23. The method of claim 18, wherein forming the plurality of first vias includes coupling the first inductor to the plurality of second pads, and wherein forming the plurality of third vias includes coupling the second inductor to the plurality of fourth pads.

24. The method of claim 23, wherein forming the plurality of second vias includes coupling the plurality of fourth pads to the plurality of first pads, and wherein forming the plurality of second vias includes coupling the plurality of third pads to the plurality of second pads.

25. The method of claim 18, further comprising:
forming a second capacitor, wherein the second capacitor includes at least a portion of the fourth metal layer, and at least one of the plurality of third pads, separated by the dielectric layer.

* * * * *